(12) United States Patent
Zhuo et al.

(10) Patent No.: US 10,630,262 B2
(45) Date of Patent: Apr. 21, 2020

(54) FILTER CIRCUIT

(71) Applicant: QUALCOMM Incorporated, San Diego, CA (US)

(72) Inventors: Wei Zhuo, San Diego, CA (US); Timothy Donald Gathman, San Diego, CA (US); Wenbang Xu, San Diego, CA (US); Li-chung Chang, Irvine, CA (US); Rui Li, San Diego, CA (US); Rahul Karmaker, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 41 days.

(21) Appl. No.: 15/867,206

(22) Filed: Jan. 10, 2018

(65) Prior Publication Data

US 2019/0028087 A1 Jan. 24, 2019

Related U.S. Application Data

(60) Provisional application No. 62/535,518, filed on Jul. 21, 2017.

(51) Int. Cl.
| | |
|---|---|
| *H03H 11/02* | (2006.01) |
| *H04B 1/00* | (2006.01) |
| *H04B 1/10* | (2006.01) |
| *H03D 7/16* | (2006.01) |
| *H04B 1/30* | (2006.01) |
| *H03D 1/04* | (2006.01) |
| *H03H 11/04* | (2006.01) |
| *H04B 15/04* | (2006.01) |

(52) U.S. Cl.
CPC ............... *H03H 11/02* (2013.01); *H03D 1/04* (2013.01); *H03D 7/165* (2013.01); *H04B 1/0028* (2013.01); *H04B 1/0082* (2013.01); *H04B 1/10* (2013.01); *H04B 1/30* (2013.01); *H03H 2011/0494* (2013.01); *H04B 15/04* (2013.01)

(58) Field of Classification Search
CPC ........... H03H 11/02; H03H 2011/0494; H03H 11/10; H04B 15/04; H04B 1/0082; H04B 1/30; H04B 1/0028; H03D 7/165; H03D 1/04

See application file for complete search history.

(56) References Cited

U.S. PATENT DOCUMENTS 6,798,282 B1 9/2004 Broekaert et al.
7,181,175 B2 * 2/2007 Nimmo-Smith ....... H01Q 21/30
455/101

(Continued)

OTHER PUBLICATIONS

Chen R., et al., "Reconfigurable Receiver with Radio-Frequency Current-Mode Complex Signal Processing Supporting Carrier Aggregation", IEEE Journal of Solid-State Circuits, vol. 50, No. 12, Dec. 2015, pp. 3032-3046.

(Continued)

*Primary Examiner* — Jung Kim
(74) *Attorney, Agent, or Firm* — Seyfarth Shaw LLP

(57) ABSTRACT

A filter circuit may include a first path having a first complex baseband filter. The circuit may further include a second path having a second complex baseband filter. The circuit may further include a combiner coupled to an output of the first complex baseband filter and an output of the second complex baseband filter.

22 Claims, 8 Drawing Sheets

(56) References Cited

U.S. PATENT DOCUMENTS

| | | | |
|---|---|---|---|
| 8,457,579 B2* | 6/2013 | Mishali | H04B 1/0092 |
| | | | 455/130 |
| 9,246,438 B2 | 1/2016 | Mikhemar et al. | |
| 9,300,337 B2* | 3/2016 | Tasic | H04B 1/26 |
| 9,991,875 B2* | 6/2018 | Gathman | H03H 11/126 |
| 2009/0088124 A1* | 4/2009 | Schuur | H04B 1/006 |
| | | | 455/341 |
| 2010/0265875 A1 | 10/2010 | Zhao et al. | |
| 2013/0287077 A1 | 10/2013 | Fernando et al. | |
| 2014/0266886 A1* | 9/2014 | Wang | G01S 19/33 |
| | | | 342/357.73 |
| 2016/0013820 A1 | 1/2016 | Yamanouchi | |
| 2016/0329949 A1 | 11/2016 | Cloutier et al. | |
| 2017/0104507 A1 | 4/2017 | Fernando et al. | |

OTHER PUBLICATIONS

Hwu S-C., et al., "An RF Receiver for Intra-Band Carrier Aggregation", IEEE Journal of Solid-State Circuits, vol. 50, No. 4, Apr. 2015, pp. 946-961.

International Search Report and Written Opinion—PCT/US2018/033694—ISA/EPO—Aug. 17, 2018.

* cited by examiner

US 10,630,262 B2

FILTER CIRCUIT

CROSS-REFERENCE TO RELATED APPLICATION

The present application claims the benefit of U.S. Provisional Patent Application No. 62/535,518, filed on Jul. 21, 2017, and titled "OFFSET ZERO INTERMEDIATE FREQUENCY (OZIF) IMPLEMENTATION IN BASEBAND FILTER (BBF)," the disclosure of which is expressly incorporated by reference herein in its entirety.

FIELD

The present disclosure relates generally to wireless communication and, more specifically, to a baseband filter (BBF) for non-contiguous carrier aggregation (NCA).

BACKGROUND

One goal driving the wireless communication industry is providing consumers with increased bandwidth. The use of carrier aggregation in current generation communications provides one possible solution for achieving this goal. Carrier aggregation enables a wireless carrier to increase bandwidth by simultaneously using multiple frequencies for a single communication stream. While an increased amount of data is provided to the end user, implementing carrier aggregation is complicated by noise created at harmonic frequencies due to frequencies used for data transmission.

Mobile radio frequency (RF) chip designs (e.g., mobile RF transceivers) have migrated to deep sub-micron process nodes due to cost and power consumption considerations. The design complexity of mobile RF transceivers is further complicated by added circuit function to support communication enhancements. For example, the design complexity of these mobile RF chips is complicated by added circuit functions to support carrier aggregation. Further design challenges for mobile RF transceivers include analog/RF performance considerations, including mismatch, noise, and other performance considerations.

In practice, some issues arise with implementing mobile RF transceivers, such as those involving non-contiguous carrier aggregation (NCA). It is desirable for a wireless device to efficiently support non-contiguous carrier aggregation.

SUMMARY

A filter circuit may include a first path having a first complex baseband filter. The circuit may further include a second path having a second complex baseband filter. The circuit may further include a combiner coupled to an output of the first complex baseband filter and an output of the second complex baseband filter.

A method of filtering may include processing a first component carrier with a first complex filter. The method may further include processing a second component carrier with a second complex filter. The method may further include combining the processed first component carrier with the processed second component carrier.

A filter circuit may include a first path having a first complex baseband filter. The circuit may further include a second path having a second complex baseband filter. The circuit may further include means for combining the first component carrier and the second component carrier.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
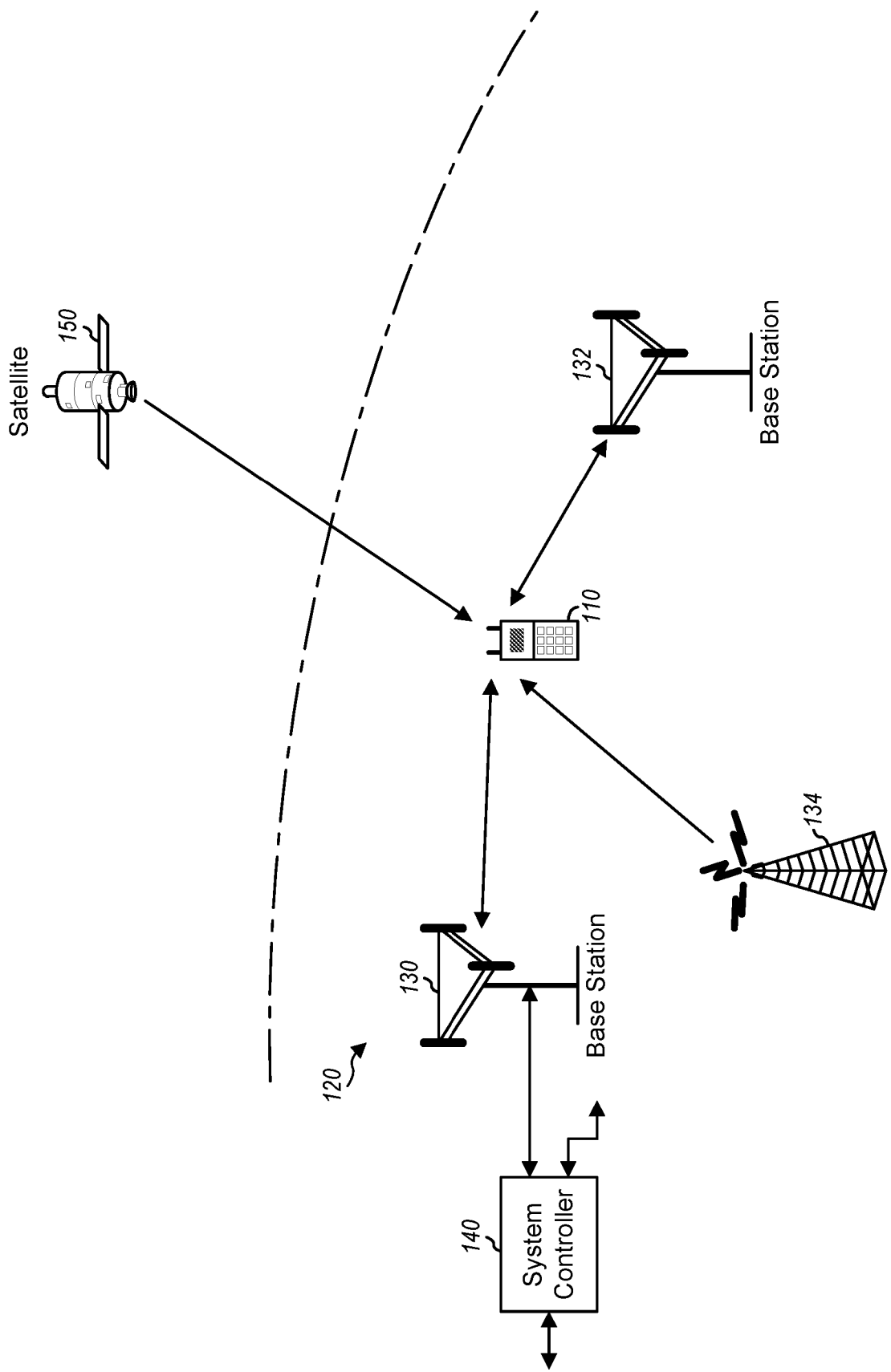
FIG. 1 shows a wireless device communicating with a wireless system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. Other aspects, as well as features and advantages of various aspects, will become apparent to those of skill in the art through consideration of the ensuing description, the accompanying drawings, and the appended claims.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Advances in technology result in smaller and more powerful computing devices. For example, a variety of portable personal computing devices currently exist, including wireless computing devices, such as portable wireless telephones, user equipments (UEs), personal digital assistants (PDAs), and paging devices that are small, lightweight, and easily carried by users. More specifically, portable wireless telephones, such as cellular telephones and Internet protocol (IP) telephones, can communicate voice and data packets over wireless networks.

One goal driving the wireless communication industry is providing consumers with increased bandwidth. The use of carrier aggregation in current generation communications provides one possible solution for achieving this goal. Carrier aggregation enables a wireless carrier to increase bandwidth by simultaneously using multiple frequencies for a single communication stream. While an increased amount of data is provided to the end user, implementing carrier aggregation is complicated by noise created at harmonic frequencies due to carrier frequencies used for data transmission.

A wireless device (e.g., a cellular phone or a smartphone) in a wireless communication system may transmit and receive data using two-way communication. The wireless device may include a transmitter for transmitting data and a receiver for receiving data. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal (via the antenna) and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, and/or a cell, etc. It is desirable for a wireless device to efficiently support carrier aggregation.

In general, carrier aggregation (CA) may be categorized into two types: intra-band CA and inter-band CA. Intra-band CA refers to operation on multiple carriers within the same band, and inter-band CA refers to operation on multiple carriers in different bands. The carriers may be contiguous or non-contiguous. Non-contiguous carrier aggregation has unique issues due to the separation of frequency bands and potential jammers within a gap between the frequency bands.

Some non-contiguous CA (NCA) architectures have two local oscillators (LOs) to address jammers. These architectures suffer from spur coupling issues between two CA paths because frequencies from the two LOs are set differently. Single LO architectures also suffer from performance issues (e.g., low signal-to-noise ratio (SNR)) because a lack of jammer frequency filtering leads to transimpedance amplifier (TIA) saturation. Additionally, these single LO architectures are unable to adjust the gains of two carriers independently from each other, and thus they do not support different bandwidth combinations.

Aspects of the present disclosure provide a radio frequency (RF) baseband filter for facilitating CA, such as NCA. In some aspects, a baseband filter may independently adjust a gain of different bandwidth combinations of different frequencies while filtering out a jammer. Advantages include significant reduction in current consumption, as compared to architectures that use two separate downlink paths (DLPs). The RF baseband filter also provides flexibility for independent gain control.

FIG. 1 shows a wireless device 110 communicating with a wireless system 120. The wireless device includes the described baseband filter. The wireless system 120 may be a 5G, long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. The wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

Figure 2:
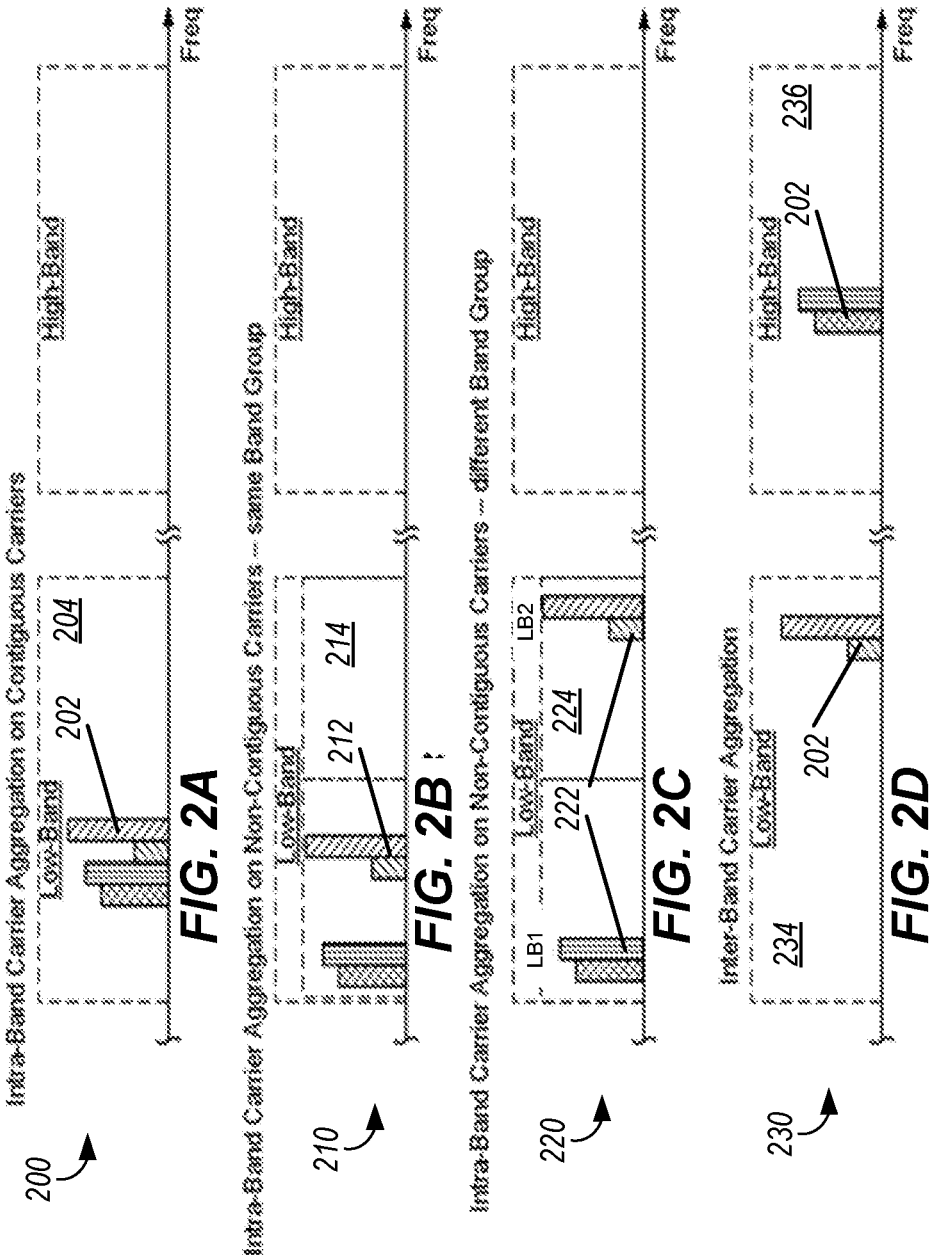
FIGS. 2A-2D show four examples of carrier aggregation.

FIG. 2A shows an example of contiguous intra-band CA 200. In the example shown in FIG. 2A, a wireless device (e.g., the wireless device 110) is configured with four contiguous carriers 202 in the same band, which is within a low-band 204. The wireless device may send and/or receive transmissions on multiple contiguous carriers within the same band.

FIG. 2B shows an example of non-contiguous intra-band CA 210. In the example shown in FIG. 2B, a wireless device (e.g., the wireless device 110) is configured with four non-contiguous carriers 212 in the same band, within a low-band 214. The carriers may be separated by 5 MHz, 10 MHz, or some other amount. The wireless device may send and/or receive transmissions on multiple non-contiguous carriers within the same band.

FIG. 2C shows an example of inter-band CA in different band groups 220. In the example shown in FIG. 2C, a wireless device (e.g., the wireless device 110) is configured with four carriers 222 in two bands within the same band group, which is a low-band 224. The wireless device may send and/or receive transmissions on multiple carriers in different bands in the same band group (e.g., low-Band 1 (LB1) and low-Band 2 (LB2) in FIG. 2C).

FIG. 2D shows an example of inter-band CA in different band groups 230. In the example shown in FIG. 2D, a wireless device (e.g., the wireless device 110) is configured with four carriers 232 in two bands in different band groups, which include two carriers in one band within a low-band 234 and two additional carriers in another band within a high-band 236. The wireless device may send and/or receive transmissions on multiple carriers in different bands in different band groups (e.g., low-band and high-band in FIG. 2D).

FIGS. 2A to 2D show four examples of carrier aggregation. Carrier aggregation may also be supported for other combinations of bands and band groups. For example, carrier aggregation may be supported for a low-band and a high-band, a mid-band and a high-band, and a high-band and a high-band.

A wireless device may support carrier aggregation. In CA architectures, blockers (e.g., transmit (Tx) leakage and jammers) limit performance of receive (Rx) circuitry. It is desirable for a wireless device to efficiently support carrier aggregation.

Figure 3:
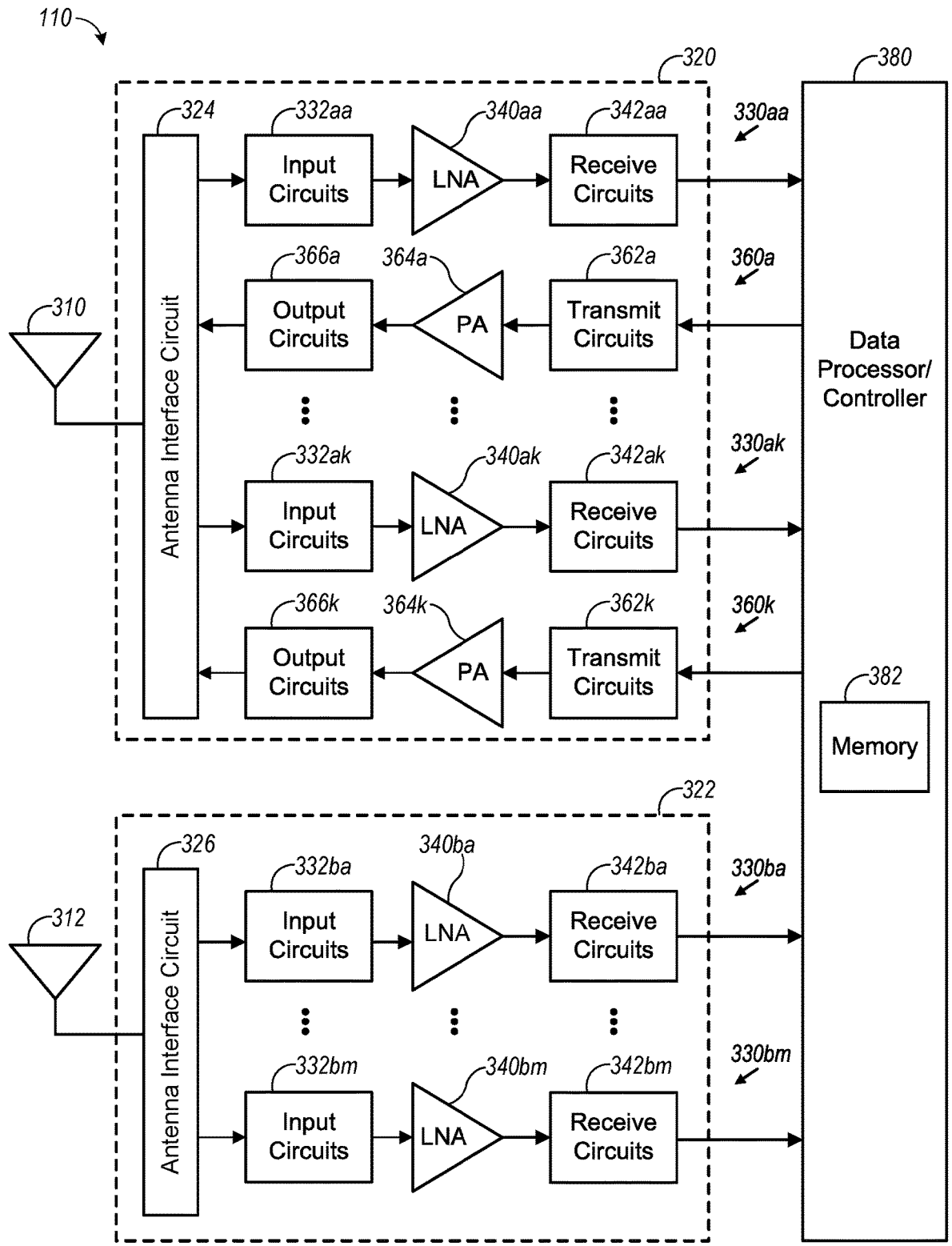
FIG. 3 shows a block diagram of the wireless device in FIG. 1.

FIG. 3 shows a block diagram of an exemplary design of the wireless device 110 in FIG. 1. In this exemplary design, the wireless device 110 includes a transceiver 320 coupled to an antenna 310 (e.g., a primary antenna), a receiver 322 coupled to a secondary antenna 312, and a data processor/controller 380. The transceiver 320 includes multiple (K) receivers (e.g., 330aa to 330ak) and multiple (K) transmitters (e.g., 360a to 360k) for supporting multiple bands, carrier aggregation, as well as multiple radio technologies. The receiver 322 include multiple (M) receivers 330ba to 330bm for supporting multiple bands, carrier aggregation, multiple radio technologies, receive diversity, and multiple-input and multiple-output (MIMO) transmission from multiple transmit antennas to multiple receive antennas, etc.

In the exemplary design shown in FIG. 3, each of the receivers 330 includes input circuits 332, a low-noise amplifier (LNA) 340, and receive circuits 342. For data reception, the antenna 310 receives signals from base stations and/or other transmitter stations and provides a received radio frequency (RF) signal, which is routed through an antenna interface circuit 324 and provided to a selected receiver. The antenna interface circuit 324 may include switches, duplexers, transmit filters, receive filters, and the like. The description below assumes that the receiver 330aa is the selected receiver. Within the receiver 330aa, the received RF signal is passed through input circuits 332aa, which provide an input RF signal to an LNA 340aa. The input circuits 332aa may include a matching circuit, a receive filter, and the like. The LNA 340aa amplifies the input RF signal and provides an output RF signal. The receive circuits 342aa amplify, filter, and downconvert the output RF signal from RF to baseband and provide an analog input signal to a data processor/controller 380. The receive circuits 342aa may include mixers, filters, amplifiers, matching circuits, an oscillator, a local oscillator (LO) generator, a phase locked loop (PLL), and the like. Each remaining one of the receivers 330 in the transceiver 320 and each of the receivers 330 in the receiver 322 may operate in a similar manner as the receiver 330aa in the transceiver 320.

In the exemplary design shown in FIG. 3, each of the transmitters 360 includes transmit circuits 362, a power amplifier (PA) 364, and output circuits 366. For data transmission, the data processor/controller 380 processes (e.g., encodes and modulates) data to be transmitted and provides an analog output signal to a selected transmitter. The description below assumes that transmitter 360a is the selected transmitter. Within the transmitter 360a, the transmit circuits 362a amplify, filter, and upconvert the analog output signal from baseband to RF for providing a modulated RF signal. The transmit circuits 362a may include amplifiers, filters, mixers, matching circuits, an oscillator, an LO generator, a PLL, and the like. A PA 364a receives and amplifies the modulated RF signal and provides a transmit RF signal having the proper output power level. The transmit RF signal is passed through output circuits 366a, routed through the antenna interface circuit 324, and transmitted via the antenna 310. The output circuits 366a may include a matching circuit, a transmit filter, a directional coupler, and the like.

FIG. 3 shows an exemplary design of the receivers 330 and the transmitters 360. A receiver and a transmitter may also include other circuits not shown in FIG. 3, such as filters, matching circuits, etc. All or a portion of the transceiver 320 and the receiver 322 may be implemented on one or more analog integrated circuits (ICs), RF ICs (RFICs), mixed-signal ICs, or other like analog circuits. For example, LNAs 340, receive circuits 342, and transmit circuits 362 may be implemented on one module, which may be an RFIC. Antenna interface circuits (e.g., 324 and 326), the input circuits 332, the output circuits 366, and the PAs 364 may be implemented on another module, which may be a hybrid module. The circuits in the transceiver 320 and the receiver 322 may also be implemented in other configurations.

The data processor/controller 380 may perform various functions for the wireless device 110. For example, the data processor/controller 380 may perform processing for data received via the receivers 330 and data being transmitted via the transmitters 360. The data processor/controller 380 may control the operation of antenna interface circuits (e.g., 324 and 326), input circuits 332, LNAs 340, receive circuits 342, transmit circuits 362, PAs 364, output circuits 366, or a combination thereof. A memory 382 may store program codes and data for the data processor/controller 380. The data processor/controller 380 may be implemented on one or more application specific integrated circuits (ASICs) and/or other ICs.

The wireless device 110 may receive transmissions from one or more base stations/cells on multiple carriers at different frequencies for CA. For example, the wireless device 110 may include a non-contiguous CA architecture with phase locked loops (PLLs) and local oscillators (LOs).

Aspects of the present disclosure provide a radio frequency (RF) baseband filter for facilitating carrier aggregation (CA), such as non-contiguous CA. In some aspects, an RF baseband filter may independently adjust a gain of different bandwidth combinations of different frequencies while filtering out a jammer. Advantages of the RF baseband filter include significant reduction in current consumption, as compared to using two separate downlink paths (DLPs), and flexibility for independent gain control.

Figure 4A:
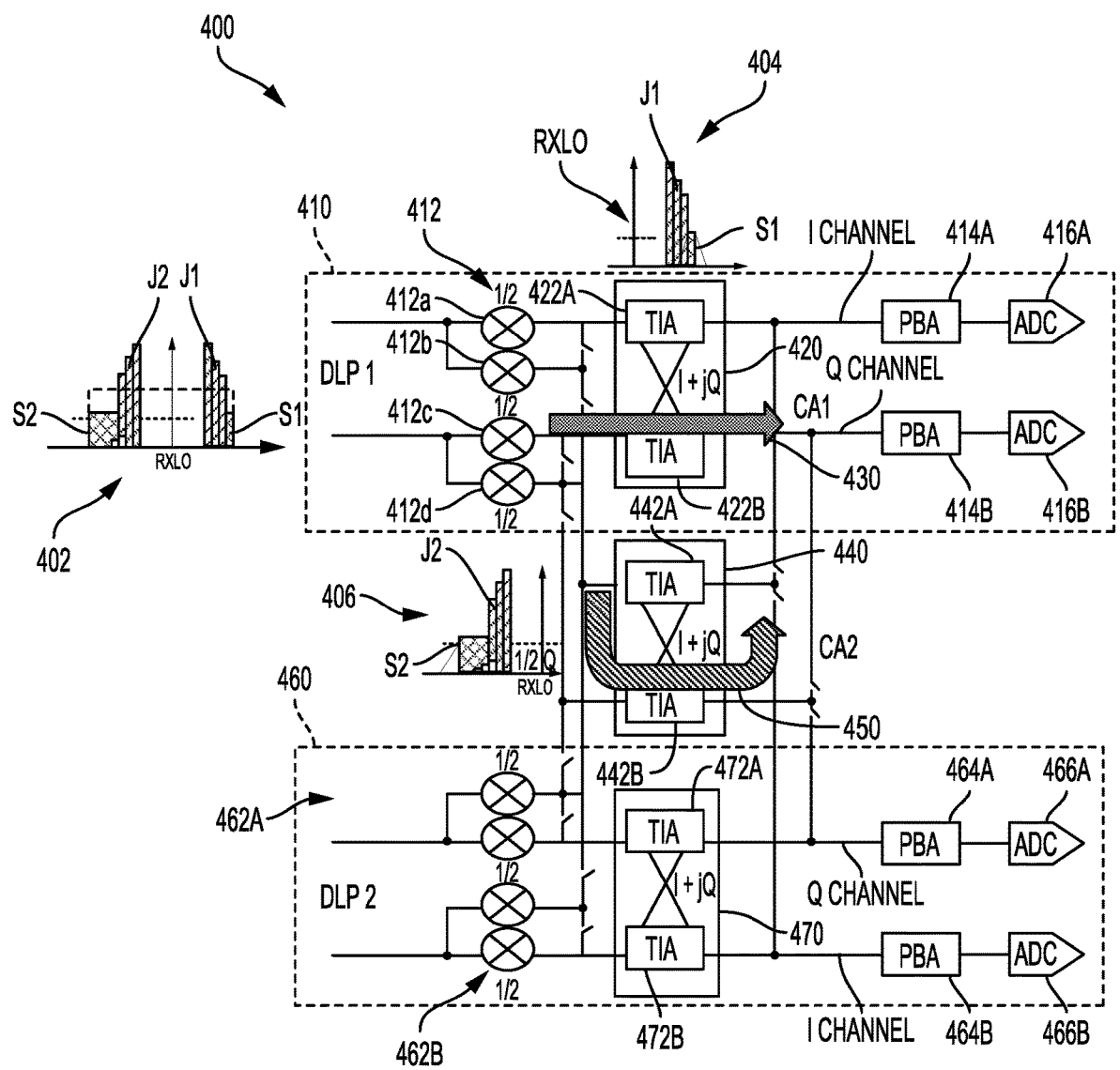
FIGS. 4A-4C show block diagrams of offset zero intermediate frequency (OZIF) filter circuits for processing non-contiguous carrier aggregation (NCA) signals, in accordance with aspects of the present disclosure.
Figure 4B:
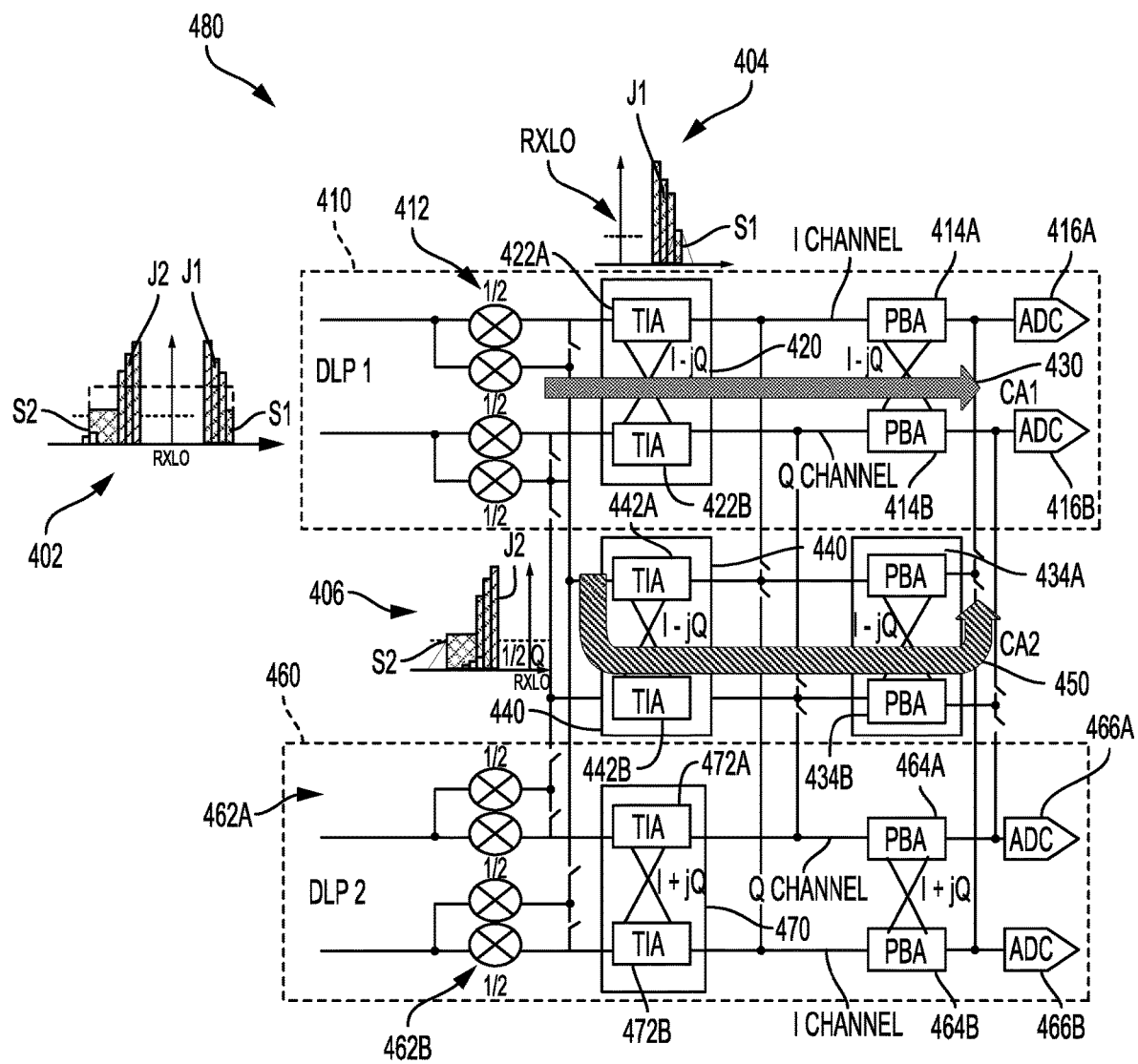
Figure 4C:
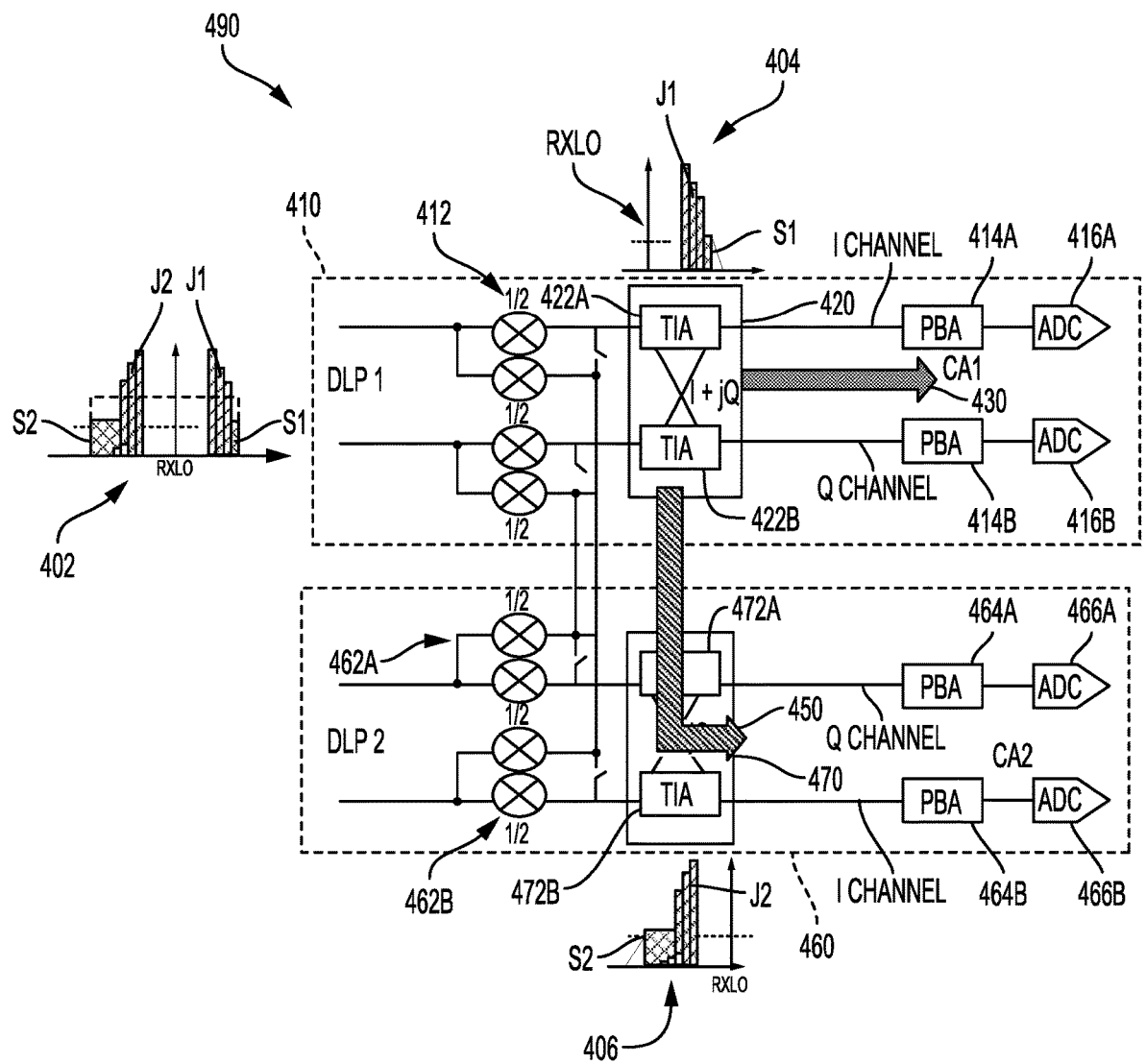

FIGS. 4A-4C show block diagrams of offset zero intermediate frequency (OZIF) filter circuits for processing non-contiguous CA signals, in accordance with aspects of the present disclosure.

Referring to FIG. 4A, an offset zero intermediate frequency (OZIF) filter circuit 400 for processing a non-contiguous carrier aggregation (NCA) signal 402 may include a first path 430 and a second path 450, in accordance with aspects of the present disclosure. The first path 430 may include a first complex filter 420 (e.g., a first complex baseband filter), and the second path may include a second complex filter 440 (e.g., a second complex baseband filter). For example, the first complex filter 420 may include a first set of cross-coupled transimpedance amplifiers (TIAs) 422A and 422B, and the second complex filter 440 may include a second set of cross-coupled transimpedance amplifiers (TIAs) 442A and 442B. The complex filters 420 and 440 may be implemented in ways other than cross-coupled TIAs, for example including, but not limited to cross-coupled transconductance amplifiers. The filter circuit 400 may be a part of a transceiver chain. The transceiver chain may also include one phase locked loop (PLL) and one local oscillator (LO).

According to aspects of the present disclosure, the filter circuit 400 may further include a first downlink path (DLP) 410 and a second DLP 460. The first DLP 410 may include a first set of mixers 412, the first complex filter 420, a programmable baseband amplifier (PBA) (e.g., a first set of PBAs 414A and 414B), and an analog-to-digital converter (ADC) (e.g., a first set of ADCs 416A and 416B). According to an aspect of the present disclosure, a combiner may include the first set of PBAs 414A and 414B. The second DLP 460 may include a second set of mixers 462A and 462B, a third complex filter 470, a second set of PBAs 464A and 464B, and a second set of ADCs 466A and 466B. The third complex filter 470 may include a third set of cross-coupled TIAs 472A and 472B. The first path 430 may include the first DLP 410.

According to an aspect of the present disclosure, the second path 450 may be coupled between the first DLP 410 and the second DLP 460. For example, an input of the second complex filter 440 may be coupled to an output of the first set of mixers 412, and an output of the second complex filter 440 may be coupled to an input of the first set of PBAs 414A and 414B. In this configuration, an NCA signal 402 may be split into a first component carrier 404 (including a signal of interest s1 and a first in-band jammer j1) and a second component carrier 406 (including a signal of interest s2 and a second in-band jammer j2) by the first set of mixers 412. The local oscillator RXLO is set to a frequency between the two signals of interest s1 and s2. The first component carrier 404 may be processed through the first complex filter 420 to attenuate the first in-band jammer, and the second component carrier 406 may be processed through the second complex filter 440 to attenuate the second in-band jammer. Additionally, a baseband frequency gain of each of the first component carrier 404 and the second component carrier 406, once processed, may be independently adjusted through each of the first path 430 and the second path 450. The first component carrier 404 and the second component carrier 406, once processed, may then be combined at the first set of PBAs 414A and 414B.

According to aspects of the present disclosure, the first set of mixers 412 and the second set of mixers 462A and 462B may include full mixers, half-mixers, and/or quarter-mixers, etc. For example, a quarter-mixer takes up less physical space than a half-mixer or a full mixer, and a half-mixer takes up less physical space than a full mixer. According to aspects of the present disclosure, a quarter-mixer is a quarter the size of a full mixer, and a half-mixer is half the size of a full mixer. The quarter-mixer and the half-mixer may otherwise function substantially the same as the full mixer. An advantage of using a smaller mixer is that less physical space is occupied, allowing for implementation of other components and/or smaller-sized devices. Additionally, each of the first set of mixers 412 and the second set of mixers 462A and 462B may be arranged in two pairs. For example, the first set of mixers 412 may include a first pair of half-mixers 412A and 412B and a second pair of half-mixers 412C and 412D. In operation, the NCA signal 402 may be split into the first component carrier 404 and the second component carrier 406 through each pair of half mixers 412A and 412B, 412C and 412D. For example, the first pair of half-mixers 412A and 412B may process the first component carrier 404, and the second pair of half-mixers 412C and 412D may process the second component carrier 406. Additionally, half-mixers 412A and 412B may each be configured to process either an in-phase (I) or quadrature phase (Q) component of the first component carrier 404, and half-mixers 412C and 412D may each be configured to process either an I or Q component of the second component carrier 406.

According to additional aspects of the present disclosure, the first set of mixers 412 may be selectively coupled to the first complex filter 420 and the second complex filter 440 through multiple switches (not labeled). Similarly, the second set of mixers 462A and 462B may be selectively coupled to the second complex filter 440 and the third complex filter 470 through multiple switches (not labeled). The second complex filter 440 may also be selectively coupled to the first set of PBAs 414A and 414B and the second set of PBAs 464A and 464B through multiple switches (not labeled). In this configuration, the second complex filter 440 of the second path 450 may be shared between the first DLP 410 and the second DLP 460.

Referring to FIG. 4B, an offset zero intermediate frequency (OZIF) filter circuit 480 for processing a non-contiguous carrier aggregation (NCA) signal 402 may include a first path 430 and a second path 450, in accordance with different aspects of the present disclosure. The first path 430 may include a first complex filter 420 (e.g., a first complex baseband filter) and a first set of programmable baseband amplifiers (PBAs) 414A and 414B, and the second path 450 may include a second complex filter 440 (e.g., a second complex baseband filter) and a third set of PBAs 434A and 434B. For example, the first complex filter 420 may include a first set of cross-coupled transimpedance amplifiers (TIAs) 422A and 422B, the second complex filter 440 may include a second set of cross-coupled TIAs 442A and 442B, and each of the first set of PBAs 414A and 414B and the third set of PBAs 434A and 434B may be cross-coupled. Cross-coupling the PBAs allows for complex signal processing for additional rejection, for example, in case the TIAs provide insufficient filtering. The complex filters 420 and 440 may be implemented in ways other than cross-coupled TIAs and PBAs, for example including, but not limited to cross-coupled transconductance amplifiers. The filter circuit 480 may further be implemented with one phase locked loop (PLL) and one local oscillator (LO).

Similar to the above, the filter circuit 480 may further include a first downlink path (DLP) 410 and a second DLP 460, according to aspects. The first DLP 410 may include a first set of mixers 412, the first complex filter 420, the first set of PBAs 414A and 414B, and a first set of analog-to-digital converters (ADCs) 416A and 416B. According to an aspect of the present disclosure, a combiner (not shown) may include the first set of PBAs 414A and 414B and/or the first set of ADCs 416A and 416B. The second DLP 460 may include a second set of mixers 462A and 462B, a third complex filter 470, a second set of PBAs 464A and 464B, and a second set of ADCs 466A and 466B. The third complex filter 470 may include a third set of cross-coupled TIAs 472A and 472B. The second set of PBAs 464A and 464B may be cross-coupled. The first path 430 may include the first DLP 410.

According to an aspect of the present disclosure, the second path 450 may be coupled between the first DLP 410 and the second DLP 460. For example, an input of the second complex filter 440 may be coupled to an output of the first set of mixers 412, an output of the second complex filter 440 may be coupled to an input of the third set of PBAs 434A and 434B, and an output of the third set of PBAs 434A and 434B may be coupled to an input of the first set of ADCs 416A and 416B. In this configuration, the NCA signal 402 may be split into a first component carrier 404 and a second component carrier 406 by the first set of mixers 412. The first component carrier 404 includes a signal of interest s1 and a first in-band jammer j1. The second component carrier 406 includes a signal of interest s2 and a second in-band jammer j2. The first component carrier 404 may be processed through the first complex filter 420 to attenuate the first in-band jammer, and the second component carrier 406 may processed through the second complex filter 440 to attenuate the second in-band jammer. Additionally, a baseband frequency gain of each of the first component carrier 404 and the second component carrier 406, once processed, may be independently adjusted through each of the first path 430 and the second path 450. The first component carrier 404 and the second component carrier 406, once processed, may then be combined at the first set of ADCs 416A and 416B.

According to additional aspects, the first set of mixers 412 may be selectively coupled to the first complex filter 420 and the second complex filter 440 through multiple switches (not labeled). Similarly, the second set of mixers 462A and 462B may be selectively coupled to the second complex filter 440 and the third complex filter 470 through multiple switches (not labeled). The second complex filter 440 may also be selectively coupled to the first set of PBAs 414A and 414B and the second set of PBAs 464A and 464B through multiple switches (not labeled). Additionally, the third set of PBAs 434A and 434B may be selectively coupled to the first set of ADCs 416A and 416B and the second set of ADCs 466A and 466B through multiple switches (not labeled). In this configuration, the second complex filter 440 and the third set of PBAs 434A and 434B of the second path 450 may be shared between the first DLP 410 and the second DLP 460.

Referring to FIG. 4C, an offset zero intermediate frequency (OZIF) filter circuit 490 for processing a non-contiguous carrier aggregation (NCA) signal 402 may include a first path 430 and a second path 450, in accordance with other aspects of the present disclosure. The first path 430 may include a first complex filter 420, and the second path may include a third complex filter 470. For example, the first complex filter 420 may be a complex baseband filter including a first set of cross-coupled transimpedance amplifiers (TIAs) 422A and 422B, and the third complex filter 470 may be a complex baseband filter including a third set of cross-coupled TIAs 472A and 472B. The complex filters 420 and 470 may be implemented in ways other than cross-coupled TIAs, for example, including, but not limited to cross-coupled transconductance amplifiers. The filter circuit 490 may further be implemented with one phase locked loop (PLL) and one local oscillator (LO).

According to aspects of the present disclosure, the filter circuit 490 may include a first downlink path (DLP) 410 and a second DLP 460. The first DLP 410 may include a first set of mixers 412, the first complex filter 420, a first set of PBAs 414A and 414B, and a first set of analog-to-digital converters (ADCs) 416A and 416B. According to an aspect of the present disclosure, a combiner (not shown) may include the first set of PBAs 414A and 414B and/or the first set of ADCs 416A and 416B. The second DLP 460 may include a second set of mixers 462A and 462B, the third complex filter 470, a second set of PBAs 464A and 464B, and a second set of ADCs 466A and 466B. The first path 430 may include the first DLP 410, and the second path 450 may include the second DLP 460.

According to an aspect of the present disclosure, the second path 450 may be coupled to the first DLP 410. For example, an input of the third complex filter 470 of the second path 450 may be coupled to an output of the first set of mixers 412 of the first DLP 410. In this configuration, the NCA signal 402 may be split into a first component carrier 404 and a second component carrier 406 by the first set of mixers 412. The first component carrier 404 includes a signal of interest s1 and a first in-band jammer j1. The second component carrier 406 includes a signal of interest s2 and a second in-band jammer j2. The first component carrier 404 may be processed through the first complex filter 420 to attenuate the first in-band jammer, and the second component carrier 406 may processed through the third complex filter 470 to attenuate the second in-band jammer. Additionally, a baseband frequency gain of each of the first component carrier 404 and the second component carrier 406, once processed, may be independently adjusted through each of the first path 430 and the second path 450. The first component carrier 404 and the second component carrier 406, once processed, may then be combined at an output of the first set of ADCs 416A and 416B and the second set of ADCs 466A and 466B.

In accordance with the above aspects, the first set of mixers 412 and the second set of mixers 462A and 462B may each include pairs of full mixers, half-mixers, quarter-mixers, etc., for processing either an in-phase (I) or quadrature phase (Q) component of the first component carrier 404 and the second component carrier 406.

According to additional aspects of the present disclosure, the first set of mixers 412 may be selectively coupled to the first complex filter 420 and the third complex filter 470 through multiple switches (not labeled). Similarly, the second set of mixers 462A and 462B may be selectively coupled to the third complex filter 470 and the first complex filter 420 through multiple switches (not labeled).

According to additional aspects of the present disclosure, the architecture of the above disclosed filter circuits may be extended to programmable gain amplifiers (PGAs) or following baseband filter circuitry. The above-disclosed architecture may also be implemented in inter-carrier aggregation cases.

Advantages of the above disclosed filter circuits include reduction and/or elimination of TIA saturation after attenuating the jammer, the ability to independently adjust a baseband frequency gain of each component carrier, and support for different carrier signal bandwidth combinations through independent tuning of each complex filter. Additional advantages include significant reduction in current consumption as compared to using separate DLPs. Additionally, for the filter circuits 400 and 480, the second DLP 460 may be utilized for legacy processing.

Figure 5:
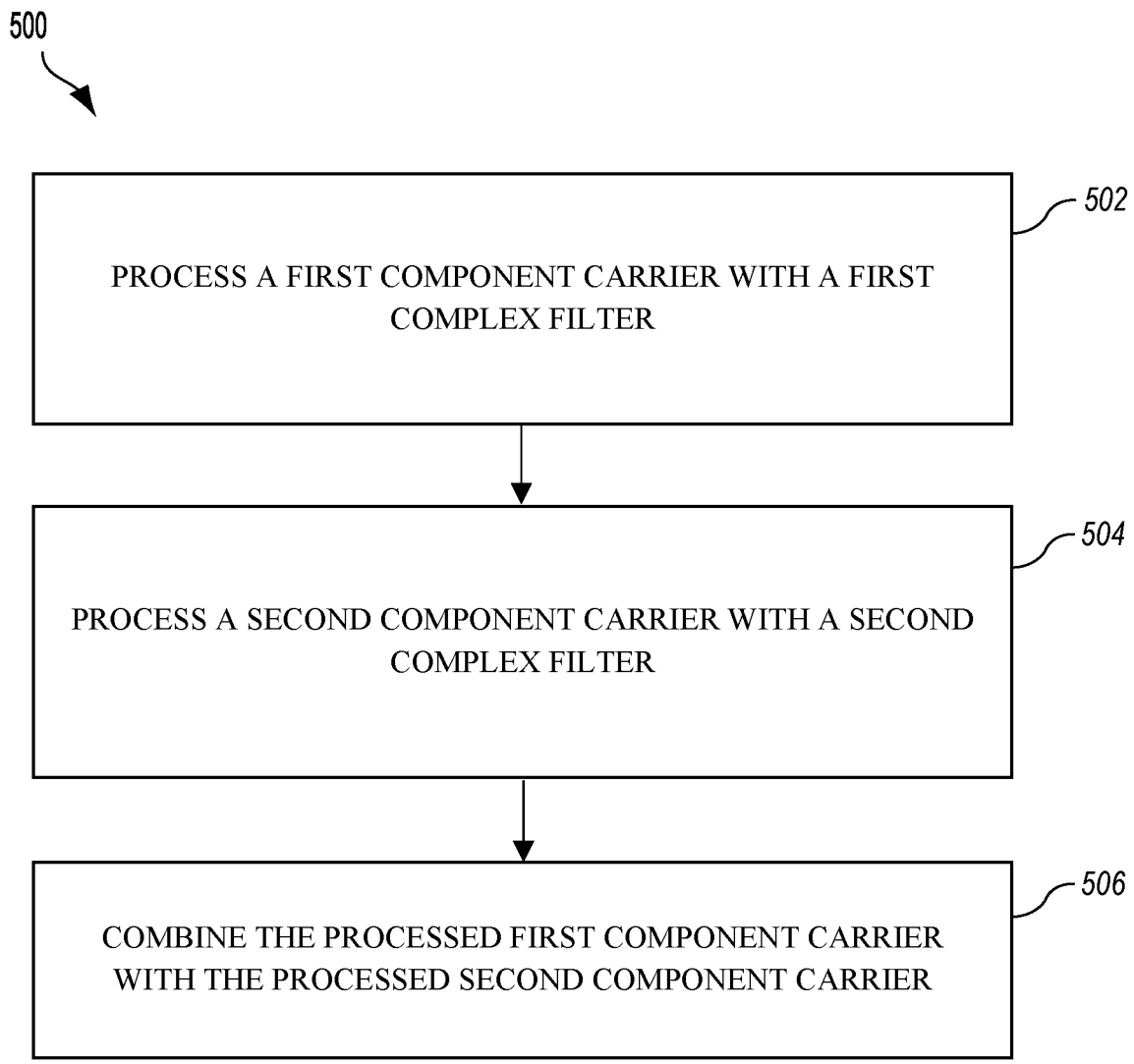
FIG. 5 is a flow diagram illustrating a method of filtering a non-contiguous carrier aggregation (NCA) signal in an offset zero intermediate frequency (OZIF) filter circuit, in accordance with aspects of the present disclosure.

FIG. 5 is a flow diagram illustrating a method 500 of filtering a non-contiguous carrier aggregation (NCA) signal in an offset zero intermediate frequency (OZIF) filter circuit, in accordance with aspects of the present disclosure. At block 502, a first component carrier is processed with a first complex filter. For example, referring to FIG. 4A, the first component carrier 404 may be processed by the first complex filter 420 to attenuate a first in-band jammer. At block 504, a second component carrier is processed with a second complex filter. For example, referring to FIG. 4A, the second component carrier 406 may be processed by the second complex filter 440 to attenuate a second in-band jammer, independently of the first in-band jammer. At block 506, the processed first component carrier is combined with the processed second component carrier. For example, referring to FIG. 4A, the first component carrier 404 and the second component carrier 406, once processed, may be combined at the first set of PBAs 414A and 414B. For example, the first component carrier 404 and the second component carrier 406 may be combined at a programmable baseband amplifier (PBA) input.

According to aspects of the present disclosure, a filter circuit is described. The filter circuit includes means for combining a first component carrier and a second component carrier of a non-contiguous carrier aggregation (NCA) signal. The combining means may, for example, include a programmable baseband amplifier (PBA) output and/or an analog-to-digital converter (ADC) output, as shown in FIGS. 4A-4C. In another aspect, the aforementioned means may be any module or any apparatus configured to perform the functions recited by the aforementioned means.

Figure 6:
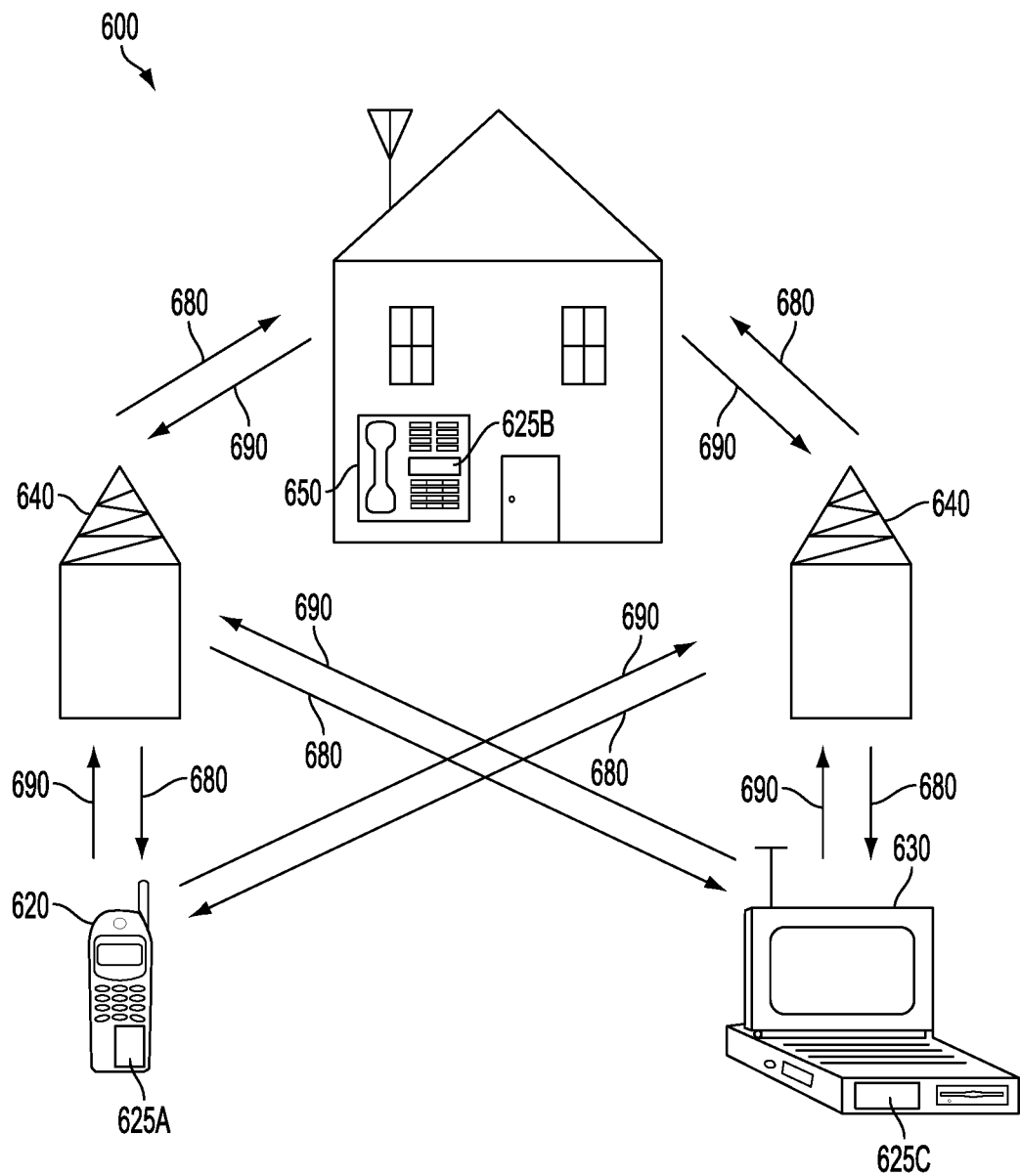
FIG. 6 is a block diagram showing an exemplary wireless communication system in which an aspect of the present disclosure may be advantageously employed.

FIG. 6 is a block diagram showing an exemplary wireless communication system 600 in which aspects of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that include the disclosed filter circuit. It will be recognized that other devices may also include the disclosed filter circuit, such as the base stations, user equipment, and network equipment. FIG. 6 shows forward link signals 680 from the base station 640 to the remote units 620, 630, and 650 and reverse link signals 690 from the remote units 620, 630, and 650 to base station 640.

In FIG. 6, remote unit 620 is shown as a mobile telephone, remote unit 630 is shown as a portable computer, and remote unit 650 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 6 illustrates remote units, the disclosure is not limited to these exemplary illustrated units. Aspects of the disclosure may be suitably employed in many devices, which include the disclosed filter circuit.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. Accordingly, the scope of the present disclosure is intended to be defined only by reference to the appended claims.

What is claimed is:

1. A filter circuit, comprising:
    a first path including a first complex baseband filter and a set of multiplexers;
    a second path including a second complex baseband filter, the set of multiplexers selectively coupled to an input of the first complex baseband filter and an input of the second complex baseband filter; and
    a combiner coupled to an output of the first complex baseband filter and an output of the second complex baseband filter, the combiner configured to combine a first component carrier, of a carrier aggregation signal, from the first path and a second component carrier, of the carrier aggregation signal, from the second path.

2. The filter circuit of claim 1, in which the carrier aggregation signal comprises a non-contiguous carrier aggregation (NCA) signal and in which the filter circuit is configured to process the NCA signal.

3. The filter circuit of claim 1, in which the carrier aggregation signal comprises a non-contiguous carrier aggregation (NCA) signal and in which the first complex baseband filter is configured to process the first component carrier of the NCA signal.

4. The filter circuit of claim 3, in which the second complex baseband filter is configured to process the second component carrier of the NCA signal, separately from the first component carrier.

5. The filter circuit of claim 1, in which the combiner comprises a programmable baseband amplifier (PBA).

6. The filter circuit of claim 5, in which the combiner is configured to combine the first component carrier and the second component carrier at an input of the PBA.

7. The filter circuit of claim 5, in which the combiner is configured to combine a first component carrier and a second component carrier at an output of the PBA.

8. The filter circuit of claim 1, in which the first complex baseband filter comprises a first set of cross-coupled transimpedance amplifiers (TIAs).

9. The filter circuit of claim 8, in which the second complex baseband filter comprises a second set of cross-coupled transimpedance amplifiers (TIAs).

10. The filter circuit of claim 1, in which the second complex baseband filter comprises a set of cross-coupled programmable baseband amplifiers (PBAs).

11. The filter circuit of claim 1, in which the combiner comprises an analog-to-digital converter (ADC).

12. The filter circuit of claim 11, in which the combiner combines a first component carrier and a second component carrier at an ADC output.

13. The filter circuit of claim 1, in which the first path comprises a first downlink path (DLP).

14. The filter circuit of claim 13, in which the second path comprises a second DLP.

15. A filter circuit, comprising:
    a first path including a first complex baseband filter and a set of multiplexers;
    a second path including a second complex baseband filter, the set of multiplexers selectively coupled to an input of the first complex baseband filter and an input of the second complex baseband filter; and
    means for combining coupled to an output of the first complex baseband filter and an output of the second complex baseband filter, the combining means configured to combine a first component carrier, of a carrier aggregation signal, from the first path and a second component carrier, of the carrier aggregation signal, from the second path.

16. The filter circuit of claim 15, in which the carrier aggregation signal comprises a non-contiguous carrier aggregation (NCA) signal and in which the filter circuit is configured to process the NCA signal.

17. The filter circuit of claim 15, in which the carrier aggregation signal comprises a non-contiguous carrier aggregation (NCA) signal and in which the first complex baseband filter is configured to process the first component carrier of the NCA signal.

18. The filter circuit of claim 17, in which the second complex baseband filter is configured to process the second component carrier of the NCA signal, separately from the first component carrier.

19. The filter circuit of claim 15, in which the first path comprises a first downlink path (DLP) and the second path comprises a second DLP.

20. The filter circuit of claim 15, in which the first complex baseband filter comprises a first set of cross-coupled transimpedance amplifiers (TIAs).

21. The filter circuit of claim 20, in which the second complex baseband filter comprises a second set of cross-coupled transimpedance amplifiers (TIAs).

22. The filter circuit of claim 15, in which the second complex baseband filter comprises a set of cross-coupled programmable baseband amplifiers (PBAs).

* * * * *